(12) United States Patent
Ding et al.

(10) Patent No.: US 6,214,667 B1
(45) Date of Patent: Apr. 10, 2001

(54) METHOD FOR FABRICATING A FLASH MEMORY

(75) Inventors: Yen-Lin Ding, Hsinchu; Gary Hong, Hsin-Chu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/292,870

(22) Filed: Apr. 16, 1999

(30) Foreign Application Priority Data

Jan. 18, 1999 (TW) .................................................. 88100701

(51) Int. Cl.⁷ .................................................. H01L 21/336
(52) U.S. Cl. ............................................. 438/257; 438/594
(58) Field of Search ....................................... 438/253, 257, 438/258, 259, 267, 593, 594, 595, 700, 706

(56) References Cited

U.S. PATENT DOCUMENTS 6,048,768 * 4/2000 Ding et al. ............................. 438/264
6,114,204 * 9/2000 Ding et al. ............................. 438/264

* cited by examiner

Primary Examiner—David Nelms
Assistant Examiner—Quoc Hoang
(74) Attorney, Agent, or Firm—Jiawei Huang; J.C. Patents

(57) ABSTRACT

An improved method for fabricating a flash memory on a semiconductor substrate is provided. A patterned gate oxide layer and a patterned mask layer are formed on the substrate. Hard material spacers are formed on sidewalls of the gate oxide layer and the mask layer. A shallow trench isolation is formed in the substrate using the mask layer and the hard material spacers as masks. The hard material spacers and the mask layer are removed. A tunneling oxide layer is formed on a portion of the substrate beside the gate oxide layer. A floating gate is formed over the gate oxide layer and the tunneling oxide layer. A dielectric layer is formed over the floating gate. A control gate is formed over the dielectric layer.

21 Claims, 5 Drawing Sheets

METHOD FOR FABRICATING A FLASH MEMORY

CROSS-REFERENCE TO RELATED APPLICATION

This application claims the priority benefit of Taiwan application Ser. No. 88100701, filed Jan. 18, 1999, the full disclosure of which is incorporated herein by reference.

BACKGROUND OF THE INVENTION

1. Field of Invention

The present invention relates to a method for fabricating a semiconductor device. More particularly, the present invention relates to a method for fabricating a flash memory.

2. Description of Related Art

Electrically erasable and programmable read only memory (EEPROM) is currently one the most widely used memory devices in personal computers and electronic equipment. A memory cell in an early, conventional EEPROM comprises a transistor with a floating gate performing write, erase, and data storage operations during electrical shut down. This conventional memory cell typically occupies a large surface area. The data access speed is between 150 ns to 200 ns. A recently developed memory cell has a faster data access speed ranging from about 70 ns to 80 ns. This memory cell is called a flash memory by Intel Co.

FIG. 1 is a schematic, cross-sectional view of a conventional flash memory. A conventional flash memory cell comprises a transistor with a floating gate. Referring to FIG. 1, a semiconductor substrate 100 is provided. A field oxide layer 101 is formed on the substrate 100 by local oxidation (LOCOS) to define an active area. A tunneling oxide layer 102 is formed on the substrate 100. A floating gate 104 is formed on the tunneling oxide layer 102. A control gate 108 is formed over the floating gate 104. A dielectric layer 106 is formed between the control gate 108 and the floating gate 104. An N-type source/drain region is formed in the substrate 100 beside the floating gate 104. Oxide spacers 114 are formed on sidewalls of the floating gate 104 and the control gate 108 to protect the transistor with the floating gate from damage.

At present, a high-density flash memory fabrication becomes increasingly more important to satisfy requirements of high integration. However, in a conventional flash memory, the active area is defined by LOCOS isolation technology. The memory cell with a LOCOS isolation structure is hard to shrink the size so that device integration cannot be increased and also the capital expenditure is not reduced.

SUMMARY OF THE INVENTION

Accordingly, the present invention provides an improved method for fabricating a flash memory. The method can minimize the cell size, increase device integration, and reduce capital expenditure for devices.

Another purpose of the invention is to provide an improved method for fabricating a flash memory so that tunnel efficiency of the flash memory is enhanced. The method can be applied in fabrication for a high-density flash memory.

To achieve these and other advantages and in accordance with the purpose of the invention, as embodied and broadly described herein, the invention provides a method for fabricating a flash memory. A semiconductor substrate is provided. A patterned gate oxide layer and a patterned mask layer are sequentially formed on the substrate. Hard material spacers are formed on sidewalls of the gate oxide layer and the mask layer. A trench is formed in the substrate using the mask layer and the hard material spacers as masks. An insulating layer is formed over the trench to form a shallow trench isolation structure and to expose the mask layer. The hard material spacers and the mask layer are removed to expose the gate oxide layer and a portion of the substrate. A tunneling oxide layer is formed on the exposed substrate. A defined first conductive layer is formed over the gate oxide layer and the tunneling oxide layer to serve as a floating gate. A dielectric layer is formed over the floating gate. A defined second conductive layer is formed over the dielectric layer to serve as a control gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 is a schematic, top view of FIG. 2D, in which FIG. 2D is a cross-sectional view taken along a cutting line II—II in FIG. 3;

FIG. 4 is a schematic, top view of FIG. 2F, in which FIG. 2F is a cross-sectional view taken along a cutting line II—II in FIG. 4;

DESCRIPTION OF THE PREFERRED EMBODIMENTS

Figure 1:
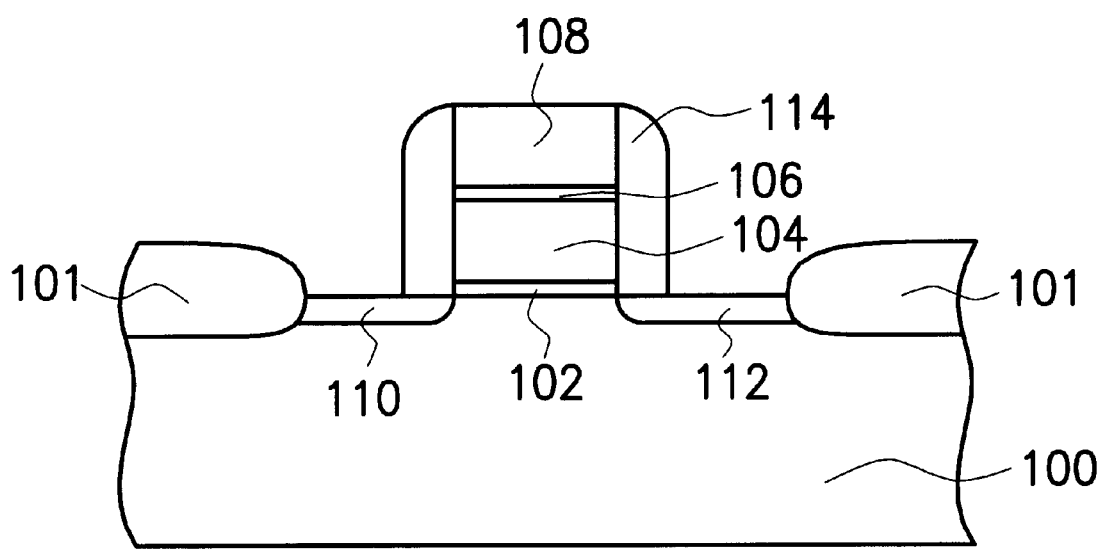
FIG. 1 is a schematic, cross-sectional view of a conventional flash memory.

Reference will now be made in detail to the present preferred embodiments of the invention, examples of which are illustrated in the accompanying drawings. Wherever possible, the same reference numbers are used in the drawings and the description to refer to the same or like parts.

In the conventional method, field oxide layers formed by local oxidation (LOCOS) are commonly used as isolation structures in a flash memory. But due to the field oxide layer's shape, it is difficult to reduce the cell size so that the flash memory fabrication cannot satisfy requirements of high integration.

FIGS. 2A through 2F are schematic, cross-sectional views showing a method of fabricating a flash memory according to one preferred embodiment of this invention. The invention forms a shallow trench isolation (STI) structure to define an active area, and provides a method for fabricating a flash memory with a self-aligned window. By the invention, the tunnel window dimension can be minimized, so tunneling efficiency is thus enhanced and the invention can be used for fabricating a high-density flash memory. The invention takes a NAND flash memory cell for example; however, this does not restrict the use of the invention.

Figure 2A:
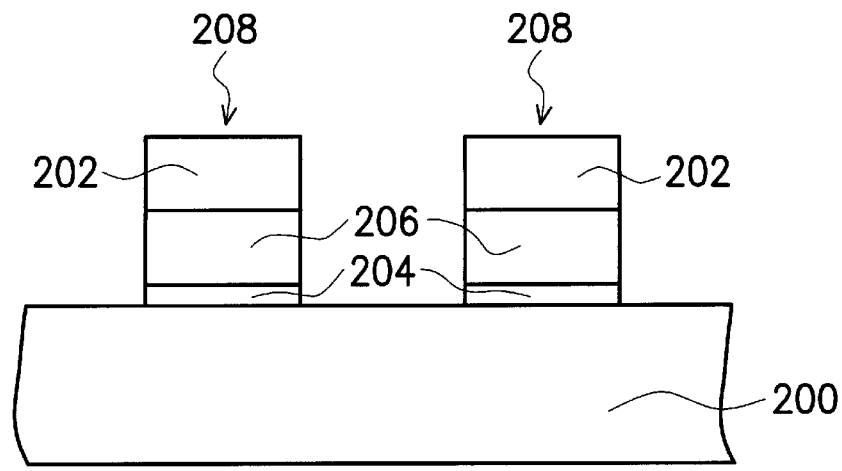
FIGS. 2A through 2F are schematic, cross-sectional views showing a method of fabricating a flash memory according to one preferred embodiment of this invention.

Referring to FIG. 2A, a semiconductor substrate 200 such as a silicate substrate is provided. An ion implantation process and a drive-in process are performed on the substrate 200 to form a well region and a channel region. A mask layer and a gate oxide layer are sequentially formed on the substrate 200. The gate oxide layer is formed, for example, by thermal oxidation. The gate oxide layer is about 50–150 Angstrom thick. The mask layer is formed, for example, by low pressure chemical vapor deposition (LPCVD). The mask layer includes, for example, silicon nitride. A photoresist layer 202 is formed over the substrate 200. The gate oxide layer and the mask layer are defined by photolithography and etching to form a mask layer 204 and a gate oxide layer 206, as shown in FIG. 2A. The region defined by the photoresist layer 202 is an active area 208 of a flash memory.

Figure 2B:
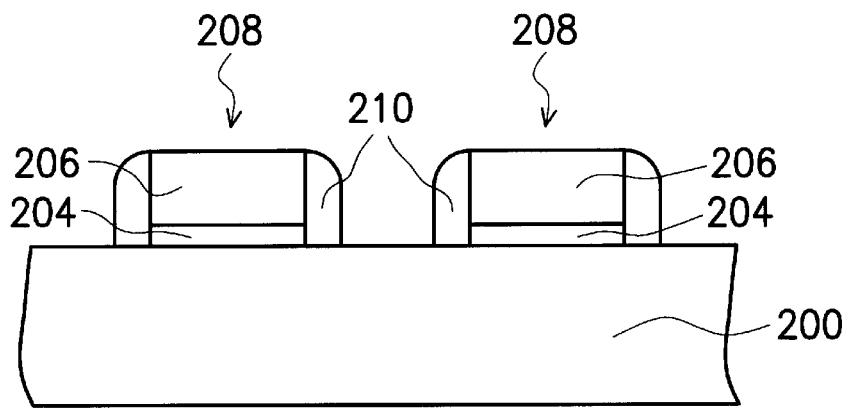

Referring to FIG. 2B, a hard material layer is formed on the substrate 200 to cover the mask layer 208 in the active area 208. The hard material layer includes, for example, silicon nitride. The hard material layer is etched back to form spacers 210 on sidewalls of the mask layer 206 and the gate oxide layer 204. The method of forming the spacers 210 includes etching back the hard material layer using the substrate 200 as a stop layer, or controlling time of etching back the hard material layer by a time control mode, for example.

Figure 2C:
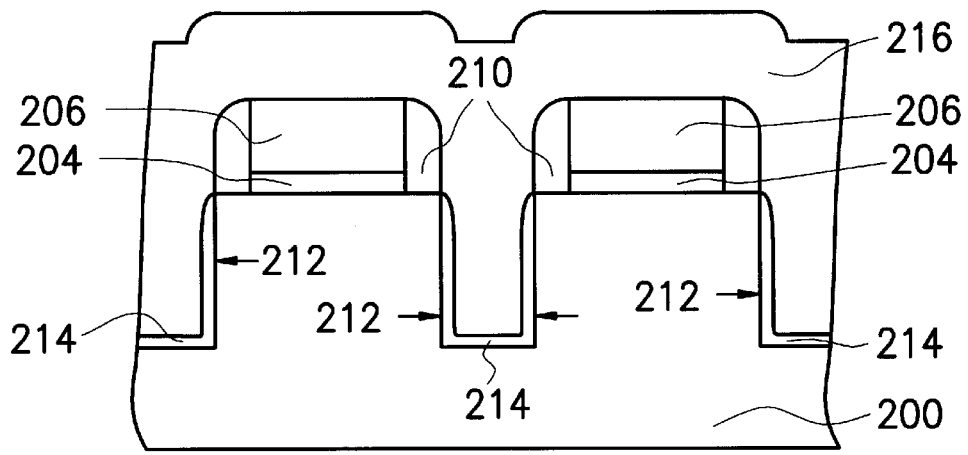

Referring to FIG. 2C, using the mask layer 206 and the spacers 210 as masks, a portion of the substrate 200 exposed in FIG. 2B is removed, for example, by dry etching to form a trench 212 in the substrate 200. The dry etching process uses $Cl_2$, HCl, and $SiCl_4$, for example, as a plasma source to etch the substrate 200 exposed in FIG. 2B. A liner oxide layer 214 is formed along the trench 212 by, for example, thermal oxidation. The liner oxide layer 214 protects the substrate 200, and increases adhesion between the substrate 200 and a subsequently formed oxide layer.

Still referring to FIG. 2C, an insulating layer 216 is formed over the substrate 200 to cover the mask layer 206 and the spacers 210 and fill the trench 212. The method of forming the insulating layer 216 includes forming a layer of tetra-ethylortho-silicate (TEOS) by atmospheric pressure (APCVD) or LPCVD, and then performing a densification process to densify the TEOS layer. Additionally, the insulating layer 216 can be formed by plasma-enhanced CVD (PECVD) to form a compact oxide layer over the substrate 200.

Figure 2D:
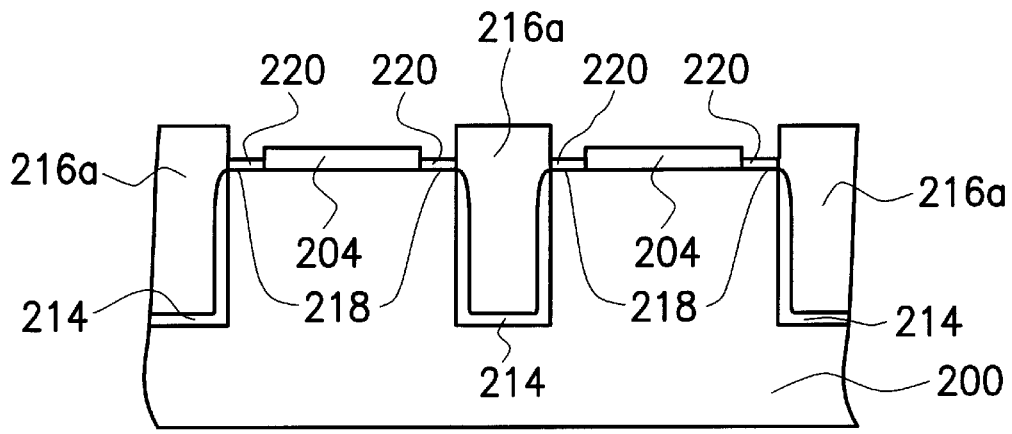

Referring to FIG. 2D, using the mask layer 206 (FIG. 2C) as a stop layer, the insulating layer 216 (FIG. 2C) on the mask layer 206 is removed, for example, by chemical-mechanical polishing (CMP). The mask layer 206 and the spacers 210 (FIG. 2C) are removed. After the polishing process, the remainder of the insulating layer 216 (FIG. 2C) forms a shallow trench isolation (STI) structure 216a shown in FIG. 2D. Since the mask layer 206 and the hard material spacers 210 (FIG. 2C) are made of silicon nitride, the mask layer 206 and the spacers 210 (FIG. 2C) are removed by wet etching using hot phosphoric acid, for example. After the removal step, the gate oxide layer 204 and surface 218 of a portion of the substrate 200 are exposed.

Figure 3:
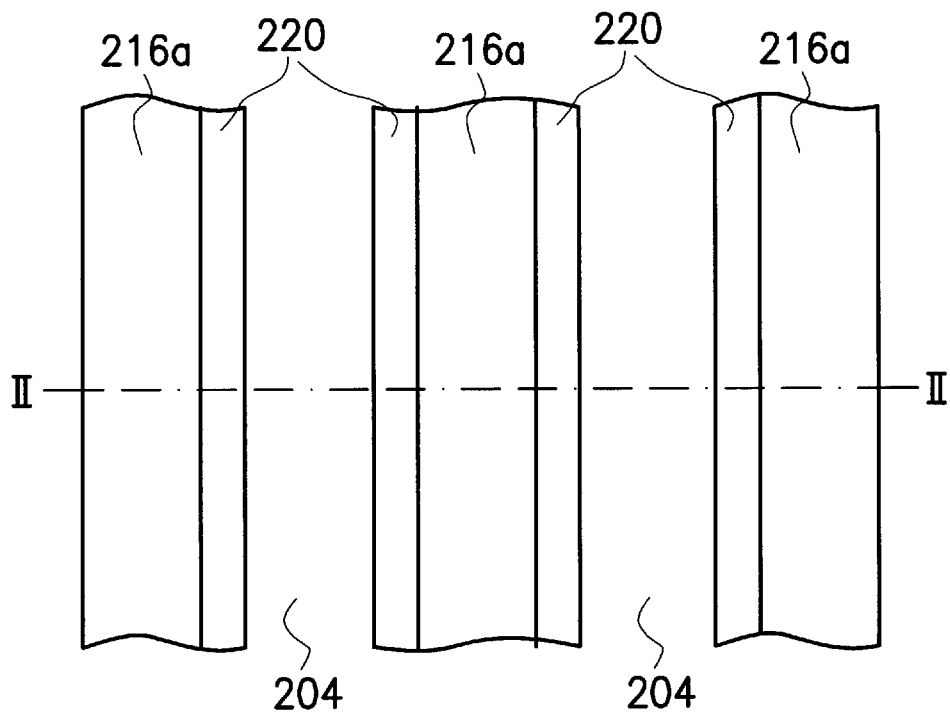

Referring to FIG. 2D and FIG. 3, FIG. 3 is a schematic, top view of FIG. 2D, in which FIG. 2D is a cross-sectional view taken along a cutting line II—II in FIG. 3. A tunneling oxide layer 220 is formed on a portion of the substrate 200 beside the gate oxide layer 204; that is, the tunneling oxide layer 220 is formed on the exposed surface 218 of the substrate 200. The tunneling layer 220 which is thinner than the gate oxide layer 204 provides electrons to penetrate through a subsequently formed floating gate. The tunneling oxide layer 220 is formed, for example, by thermal oxidation. Since the surface 218 of the substrate 200 is exposed by removing the hard material spacers 210 (FIG. 2C), the method has a self-aligned function. Therefore, the tunneling oxide layer 220 has smaller length than a tunnel oxide layer formed according to the design rule. In the invention, the tunneling oxide layer 220 is about 70–100 Angstrom thick.

Figure 2E:
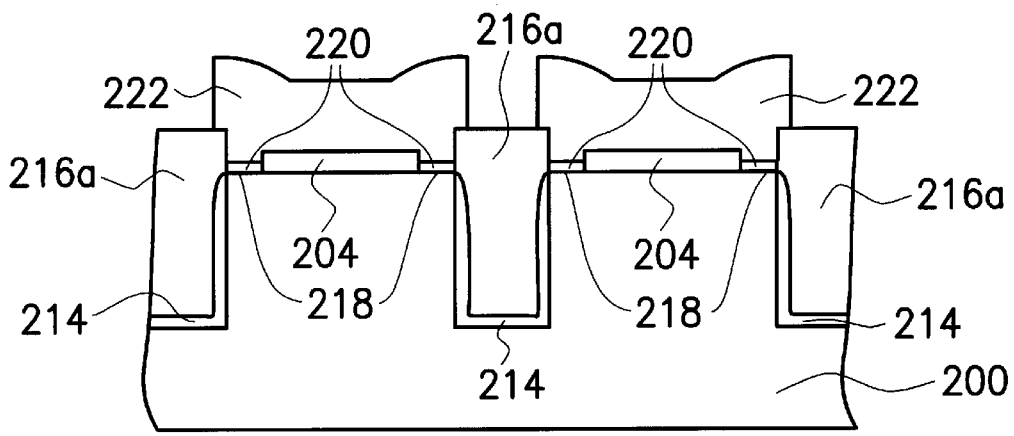
Figure 4:
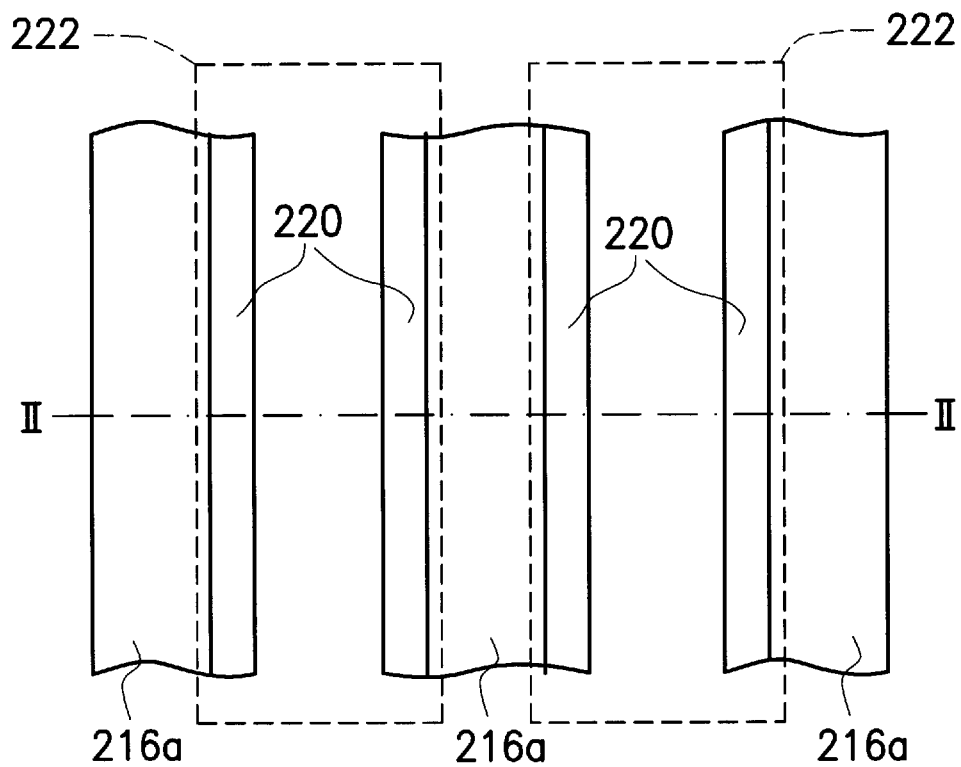

Referring to FIG. 2E and FIG. 4, FIG. 4 is a schematic, top view of FIG. 2E, in which FIG. 2E is a cross-sectional view taken along a cutting line II—II in FIG. 4. After the tunneling oxide layer 220 is formed, a conductive layer such as a doped polysilicon layer is formed over the substrate 200. The conductive layer is defined to form a conductive layer 222 to cover the gate oxide layer 204, the tunneling oxide layer 220, and a portion of the trench isolation structure 216a, as shown in FIG. 2E and FIG. 4.

The conductive layer 222 serves as a floating gate of a subsequently formed flash memory.

Figure 2F:
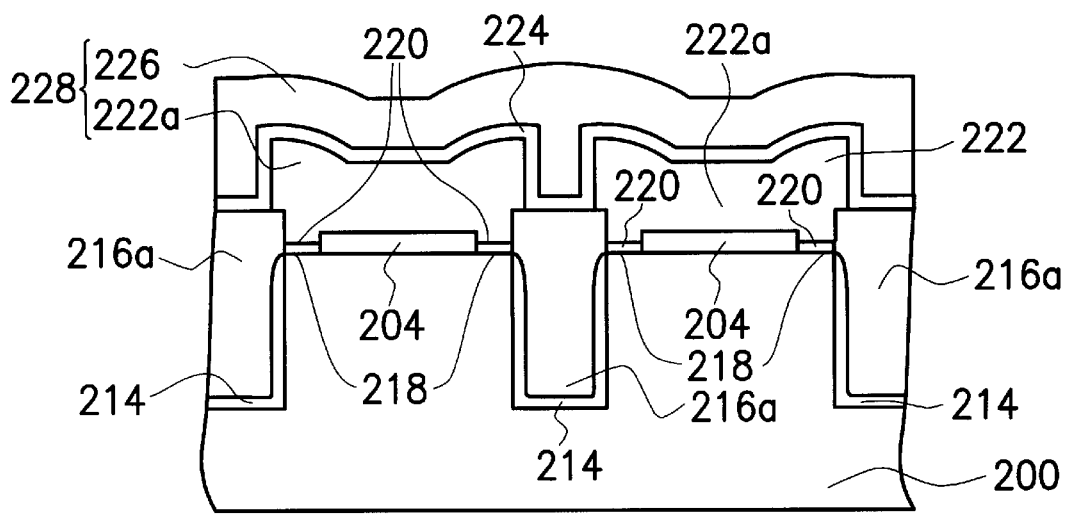
Figure 5:
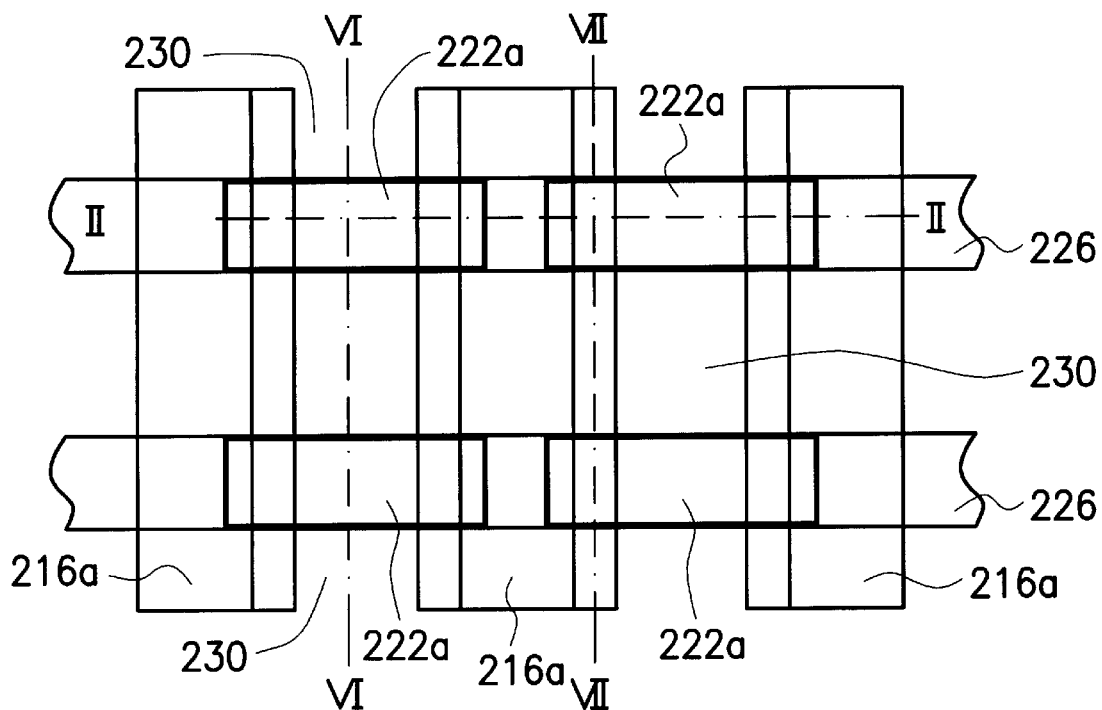
FIG. 5 shows a layout of a flash memory of a preferred embodiment according to the invention.

Referring to FIG. 2F and FIG. 5, FIG. 5 is a schematic, top view of FIG. 2F, in which FIG. 2F is a cross-sectional view taken along a cutting line II—II in FIG. 5. A dielectric layer 224 is formed over the substrate 200. The dielectric layer 224 includes, for example, oxide-nitride-oxide (ONO). Another conductive layer such as a doped conductive layer is formed over the dielectric layer 224. The conductive layer, the dielectric layer 224, and the conductive layer 222 serving as the floating gate are defined to form a floating gate 222a and a conductive layer 226, as shown in FIG. 5. The conductive layer 226 serves as a control gate of a flash memory. At this step, a stacked gate 228 including the floating gate 222a and the control gate 226 is formed in a flash memory.

Figure 6:
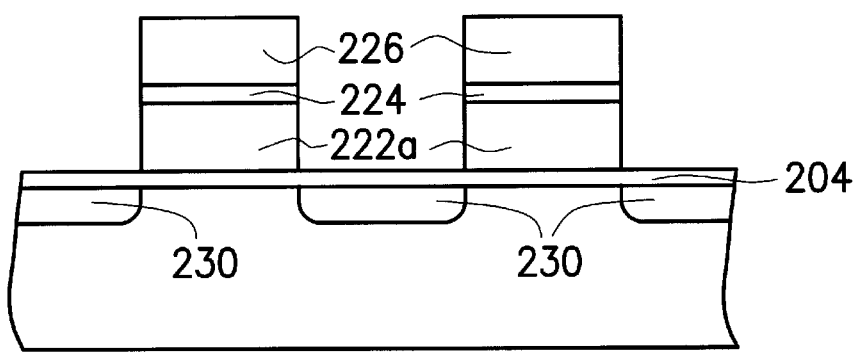
FIG. 6 is a cross-sectional view taken along a cutting line VI—VI in FIG. 5.
Figure 7:
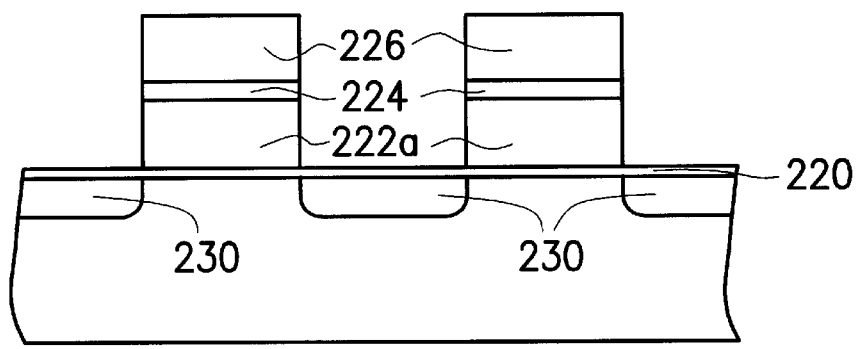
FIG. 7 is a cross-sectional view taken along a cutting line VII—VII in FIG. 5.

FIG. 6 is a cross-sectional view taken along a cutting line VI—VI in FIG. 5, while FIG. 7 is a cross-sectional view taken along a cutting line VII—VII in FIG. 5. Referring to FIGS. 5, FIG. 6, and FIG. 7, a source/drain region 230 is formed in the substrate 200 beside the gate 228. Electrons in the flash memory transfer among the source/drain region 230, the substrate 200, and the floating gate 222a by the tunneling oxide layer 220 and voltage control of the control gate 226; therefore, erase and program operations can be successfully performed.

In the invention, the tunneling oxide layer is formed on the substrate exposed by removing the hard material spacers, therefore, the method has a self-aligned function so as to reduce the tunneling oxide layer size. Moreover, the thicker gate oxide layer is formed so that capacitance of a capacitor generated between the floating gate and the substrate is decreased. Consequently, coupling ratio of the stack gate is increased, and tunneling efficiency is also increased.

Additionally, the invention forms the shallow trench isolation (STI) structure to isolate the active area. The size of the shallow trench isolation structure is easier to control, which increases device integration. Therefore, the flash memory in the invention can be used in high-density devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a flash memory on a semiconductor substrate, comprising:

sequentially forming a patterned gate oxide layer and a patterned mask layer on the substrate;

forming a hard material spacers on sidewalls of the gate oxide layer and the mask layer;

forming a shallow trench isolation structure in the substrate using the mask layer and the bard material spacers as masks;

removing the hard material spacers and the mask layer;

forming a tunneling oxide layer on a portion of the substrate beside the gate oxide layer;

forming a floating gate over the gate oxide layer and the tunneling oxide layer;

forming a dielectric layer over the floating gate; and forming a control gate over the dielectric layer.

2. The method according to claim 1, wherein the mask layer comprises silicon nitride.

3. The method according to claim 1, wherein the hard material spacers comprises silicon nitride.

4. The method according to claim 1, wherein the gate oxide layer is about 50–150 Angstrom thick.

5. The method according to claim 1, wherein the shallow trench isolation structure further comprises a liner oxide layer.

6. The method according to claim 1, wherein the hard material spacers and the mask layer are removed by wet etching.

7. The method according to claim 1, wherein the tunneling oxide layer is about 70–100 Angstrom thick.

8. The method according to claim 1, wherein the tunneling oxide layer is formed by thermal oxidation.

9. The method according to claim 1, wherein the dielectric layer comprises oxide/nitride/oxide (ONO).

10. A method for fabricating a flash memory on a semiconductor substrate, comprising:

sequentially forming a patterned gate oxide layer and a patterned mask layer on the substrate;

forming a hard material spacers on sidewalls of the gate oxide layer and the mask layer;

forming a trench in the substrate using the mask layer and the hard material spacers as masks;

forming an insulating layer over the trench to form a shallow trench isolation structure and to expose the mask layer;

removing the hard material spacers and the mask layer to expose the gate oxide layer and a portion of the substrate;

forming a tunneling oxide layer on the exposed substrate;

forming a defined first conductive layer over the gate oxide layer and the tunneling oxide layer to serve as a floating gate;

forming a dielectric layer over the floating gate; and forming a defined second conductive layer over the dielectric layer to serve as a control gate.

11. The method according to claim 10, wherein the mask layer comprises silicon nitride.

12. The method according to claim 10, wherein the hard material spacers comprises silicon nitride.

13. The method according to claim 10, wherein the trench is formed by dry etching.

14. The method according to claim 10, wherein after the trench is formed, a liner oxide layer is further formed along the trench.

15. The method according to claim 10, wherein the step of forming the insulating layer over the trench to form the shallow trench isolation structure further comprises:

forming an insulating layer over the substrate;

removing the insulating layer by chemical-mechanical polishing using the mask layer as a mask to form the shallow trench isolation structure.

16. The method according to claim 10, wherein the hard material spacers and the mask layer are removed by wet etching.

17. The method according to claim 10, wherein the tunneling oxide layer is about 70–100 Angstrom thick.

18. The method according to claim 10, wherein the tunneling oxide layer is formed by thermal oxidation.

19. The method according to claim 10, wherein the dielectric layer comprises oxide/nitride/oxide (ONO).

20. The method according to claim 10, wherein the first conductive layer comprises polysilicon.

21. The method according to claim 10, wherein the gate oxide layer is about 50–150 Angstrom thick.

* * * * *